United States Patent
Yonemura et al.

(10) Patent No.: US 7,364,831 B2
(45) Date of Patent: *Apr. 29, 2008

(54) POSITIVE RESIST COMPOSITION AND RESIST PATTERN FORMATION METHOD

(75) Inventors: Kouji Yonemura, Kawasaki (JP); Taku Nakao, Kawasaki (JP)

(73) Assignee: Tokyo Ohka Kogyo Co., Ltd., Kawasaki-shi (JP)

(*) Notice: Subject to any disclaimer, the term of this patent is extended or adjusted under 35 U.S.C. 154(b) by 134 days.

This patent is subject to a terminal disclaimer.

(21) Appl. No.: 11/123,357

(22) Filed: May 6, 2005

(65) Prior Publication Data

US 2006/0014100 A1    Jan. 19, 2006

(30) Foreign Application Priority Data

May 12, 2004  (JP)  ............ P 2004-142581

(51) Int. Cl.
G03F 7/004 (2006.01)

(52) U.S. Cl. ............... 430/270.1; 430/170; 430/905; 430/910

(58) Field of Classification Search ............ 430/270.1, 430/905, 910, 170; 403/270.1
See application file for complete search history.

(56) References Cited

U.S. PATENT DOCUMENTS

| | | | | |
|---|---|---|---|---|
| 5,942,367 | A * | 8/1999 | Watanabe et al. | 430/170 |
| 5,976,759 | A * | 11/1999 | Urano et al. | 430/270.1 |
| 6,033,826 | A * | 3/2000 | Urano et al. | 430/270.1 |
| 6,143,460 | A | 11/2000 | Kobayashi et al. | |
| 6,432,608 | B1 * | 8/2002 | Fujie et al. | 430/270.1 |
| 6,627,381 | B1 | 9/2003 | Uetanie et al. | |
| 6,656,660 | B1 * | 12/2003 | Urano et al. | 430/270.1 |
| 6,723,483 | B1 * | 4/2004 | Oono et al. | 430/170 |
| 6,846,609 | B2 | 1/2005 | Uetanie et al. | |
| 7,005,230 | B2 | 2/2006 | Yamamoto et al. | |
| 2002/0164540 | A1 | 11/2002 | Nakanishi et al. | |
| 2005/0042541 | A1* | 2/2005 | Hagihara et al. | 430/270.1 |
| 2006/0251986 | A1* | 11/2006 | Sato et al. | 430/270.1 |

FOREIGN PATENT DOCUMENTS

| | | |
|---|---|---|
| EP | 1 357 284 | 8/2002 |
| GB | 2 356 258 | 5/2001 |
| JP | 04-211258 | 8/1992 |
| JP | 06-69118 | 3/1994 |
| JP | 11-119443 | 4/1999 |
| JP | 11-168052 | 6/1999 |
| JP | 2000-188250 | 7/2000 |
| JP | 2000-356850 | 12/2000 |
| JP | 2001-274062 | 10/2001 |
| JP | 2002-241442 | 1/2002 |
| JP | 2002-287363 | 10/2002 |
| WO | WO 00/46640 | 8/2000 |
| WO | WO 01/73512 | 10/2001 |

* cited by examiner

Primary Examiner—John S. Chu
(74) Attorney, Agent, or Firm—Knobbe, Martens Olson & Bear LLP

(57) ABSTRACT

A positive resist composition includes a resin component (A) whose alkaline solubility changes by an action of an acid, an acid generator component (B), and polypropylene glycol, wherein the component (A) includes a resin component (A1) including a constitutional unit (a1) represented by general formula (I), a constitutional unit (a2) represented by general formula (II), and a constitutional unit (a3) having an acid dissociable dissolution inhibiting group,

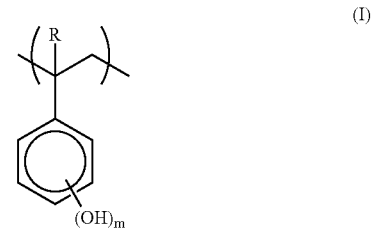

wherein R represents a hydrogen atom or a methyl group, and m represents an integer of 1 to 3,

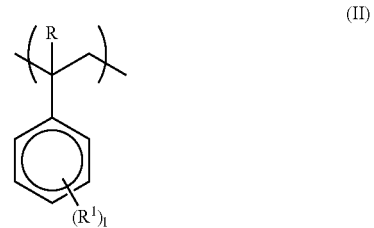

wherein R represents a hydrogen atom or a methyl group, and $R^1$ represents alkyl group having a carbon number of 1 to 5, and l represents an integer of 0 to 3.

8 Claims, No Drawings

POSITIVE RESIST COMPOSITION AND RESIST PATTERN FORMATION METHOD

BACKGROUND OF THE INVENTION

1. Field of the Invention

The present invention relates to a positive resist composition and a resist pattern formation method using the same.

Priority is claimed on Japanese Patent Application No. 2004-142581, filed May 12, 2004, the content of which is incorporated herein by reference.

2. Description of Related Art

In recent production for semiconductor elements or liquid crystal elements, miniaturization has been rapidly advanced by progress of lithography techniques. For this miniaturization, the wavelength of the light source for the exposure has been shortened generally. Specifically, KrF excimer lasers (248 nm) are now used; furthermore, ArF excimer lasers (193 nm) are about to be introduced, while ultraviolet light as represented by g-line and i-line has been used in the past.

A chemically amplified resist composition is known as one of the resist materials which satisfy the conditions for the resolution being high enough to reproduce the miniaturized pattern. The chemically amplified resist composition is composed of a base resin whose alkaline solubility changes by an action of an acid, and an acid generator which generates an acid by the exposure, and both are dissolved in organic solvent.

Generally, a polyhydroxystyrene type resin, some of whose hydroxyl groups are protected by acid dissociable dissolution inhibiting groups, is used as a base resin in the chemically amplified positive resist composition which is proposed as the preferable resist material for the exposure method using KrF excimer lasers (for example, see patent document 1).

As the acid dissociable dissolution inhibiting group, a so-called acetal group including a linear ether group as represented by a 1-ethoxyethyl group and a cyclic ether group as represented by a tetrahydropyranyl group, a tertiary alkyl group as represented by a tertiary butyl group, or a tertiary alcoxycarbonyl group as represented by a tertiary butoxycarbonyl group is mainly used.

In recent years, the improvement of the resolution of the resist material has been keenly sought, as the speed of the miniaturization is being accelerated. In addition, the resist pattern with high cross sectional rectangular formability and favorable shape has also been keenly sought.

However, as the needs of the resolution and favorable shape of the resist pattern become severe, the problems occur in that the conventional chemically amplified positive resist composition cannot be sufficiently compatible with these needs. Specifically, it is difficult to simultaneously achieve the high resolution, favorable shape, and the wide depth of focus of the resist pattern.

[Patent document 1] Japanese Unexamined Patent Application, First Publication No. Hei 4-211258

SUMMARY OF THE INVENTION

Objects of the present application are to provide a positive resist composition, which forms the resist pattern with the high resolution, favorable shape, and the wide depth of focus, and a resist pattern formation method using the same.

To achieve the aforementioned objects, the first aspect of the present invention provides a positive resist composition comprising a resin component (A) whose alkaline solubility changes by an action of an acid, an acid generator component (B), and polypropylene glycol, wherein the resin component (A) includes a resin component (A1) including a constitutional unit (a1) represented by general formula (I), a constitutional unit (a2) represented by general formula (II), and a constitutional unit (a3) having an acid dissociable dissolution inhibiting group,

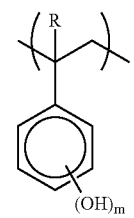

(I)

wherein R represents a hydrogen atom or a methyl group, and m represents an integer of 1 to 3,

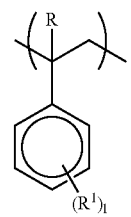

(II)

wherein R represents a hydrogen atom or a methyl group, and $R^1$ represents alkyl group having a carbon number of 1 to 5, and l represents an integer of 0 to 3.

The second aspect of the present invention provides a resist pattern formation method comprising applying the positive resist composition described above on a substrate, followed by prebaking, selective exposure, PEB (post exposure baking), and alkaline development, thereby forming a resist pattern.

In this description, "(meth)acrylic acid" indicates one or both of methacrylic acid and acrylic acid. "Constitutional unit" indicates the monomer unit which constitutes a polymer. "Lower alkyl groups" indicates alkyl groups having a carbon number of 1 to 5.

Also, in this description, "aliphatic" is the concept relative to aromaticity and is defined as the word indicating non-aromatic groups or non-aromatic compounds. "Aliphatic monocyclic group" indicates non-aromatic monocyclic groups, and "aliphatic polycyclic group" indicates non-aromatic polycyclic groups. "Aliphatic monocyclic group" and "aliphatic polycyclic group" are not limited to be the groups consisting of carbon and hydrogen, while it is preferable to be hydrocarbon groups. "Aliphatic monocyclic group" and "aliphatic polycyclic group" may be saturated or unsaturated, while it is usually preferable to be saturated.

According to the positive resist composition and the resist pattern formation method of the present invention, it is possible to form the resist pattern with the high resolution, the wide depth of focus, and favorable cross sectional shape.

DETAILED DESCRIPTION OF THE INVENTION

The positive resist composition of the present invention comprises a resin component (A) whose alkaline solubility changes by an action of an acid, an acid generator component (B), and polypropylene glycol.

The molecular weight of polypropylene glycol (hereinafter occasionally abbreviated to PPG) is preferably 500 to 5000, more preferably 700 to 3000.

The content of PPG in the positive resist composition is preferably 0.2 to 5.0 parts by mass and more preferably 0.5 to 2.0 parts by mass per 100 parts by mass of the component (A). When the content of PPG is 2.0 parts by mass or more, the resolution and the depth of focus become improved effectively. Also, the content of PPG is preferably 5.0 parts by mass or less so as to suppress the deterioration of pattern shape, specifically standing wave (the phenomena that the shape of side walls of the resist pattern have a wave pattern).

Component (A), Component (A1)

The resin component (A) comprises the resin component (A1) including the constitutional units (a1), (a2), and (a3). In the resin component (A1), the cleavage at the constitutional unit (a3) occurs due to an action of an acid, thereby increasing the alkaline solubility of the resin which used to be insoluble in alkaline developer. Accordingly, the chemically amplified positive resist pattern can be obtained by using the resist composition comprising the component (A1) and the acid generator component (B).

Constitutional Unit (a1)

Constitutional unit (a1) is represented by general formula (I). In the general formula (I), R represents a hydrogen atom or a methyl group, while a hydrogen atom is preferable. The position of the hydroxyl group may be either ortho-position, meta-position, or para-position, while para-position is preferable because of easy availability and inexpensiveness. Also, m represents an integer of 1 to 3, while 1 is preferable.

Constitutional Unit (a2)

Constitutional unit (a2) is represented by general formula (II). In the general formula (II), R represents a hydrogen atom or a methyl group, while a hydrogen atom is preferable. $R^1$ represents a linear or branched alkyl group having a carbon number of 1 to 5, and examples of $R^1$ includes a methyl group, an ethyl group, a propyl group, an isopropyl group, a n-butyl group, an isobutyl group, a tert-butyl group, a pentyl group, isopentyl group, and neopentyl group, while a methyl group or an ethyl group is preferable industrially. In the general formula (II), l represents an integer of 0 to 3, while 0 or 1 is preferable, and 0 is most preferable because of industrial availability. When l is an integer of 1 to 3, the position of $R^1$ may be ortho-position, meta-position, or para-position. When l is 2 or 3, the positions of the substitutions can be arbitrarily combined.

Constitutional Unit (a3)

Constitutional unit (a3) has an acid dissociable dissolution inhibiting group. Examples of the main chain of the constitutional unit (a3) include a (meth)acrylic acid backbone and a hydroxystyrene backbone represented by the general formula (I). In the case of the (meth)acrylic acid backbone, the constitutional unit (a3), whose ethylenic double bond is cleaved and whose carboxylic group is linked by an acid dissociable dissolution inhibiting group instead of the hydrogen atom thereof (—C(O)—O—R'; R' is the acid dissociable dissolution inhibiting group), is used. In the case of the hydroxystylene backbone, the constitutional unit (a3), the hydrogen atom of whose hydroxyl group is substituted with the acid dissociable dissolution inhibiting group, is used. These main chain backbones can be appropriately selected according to the kind of the acid dissociable dissolution inhibiting group.

There are no particular limitations on the acid dissociable dissolution inhibiting group of constitutional unit (a3), and a suitable acid dissociable dissolution inhibiting group can be selected from among the groups which are used to protect the hydroxyl group of the resin component forming the coated film. However, it is preferable to use one or a combination of two or more selected from the constitutional unit (a3-1) whose acid dissociable dissolution inhibiting group is a tertiary alkyl group containing an aliphatic monocyclic group, the constitutional unit (a3-2) whose acid dissociable dissolution inhibiting group is tertiary alkyl group containing an aliphatic polycyclic group, and the constitutional unit (a3-3) whose acid dissociable dissolution inhibiting group is a cross-linking group represented by general formula (III).

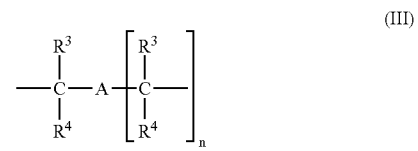

(III)

In the general formula (III), $R^3$ and $R^4$ independently represent lower alkyl groups, and n represents an integer of 1 to 3, and A represents a single bond or a (n+1)-valent organic group.

Constitutional Unit (a3-1)

Examples of the aliphatic monocyclic group include the groups of cycloalkane, one of whose hydrogen atoms is removed. Specific examples of the aliphatic monocyclic group include the groups of cyclopentane and cyclohexane, one of whose hydrogen atoms is removed, while a cyclohexyl group is preferable.

Examples of the tertiary alkyl group containing the aliphatic monocyclic group include 1-methyl cyclohexyl group, 1-ethyl cyclohexyl group, 1-methyl cyclopentyl group, and I -ethyl cyclopentyl group. These aliphatic monocyclic groups linked with the lower alkyl group substitute for the hydrogen atom of the carboxylic group of (meth) acrylic acid or the hydrogen atom of the hydroxyl group of hydroxystyrene, thereby forming an acid dissociable tertiary alkyl ester on the substituent ring.

It is also possible to use the constitutional unit (a3-1), wherein the carboxylic group of (meth)acrylic acid or the hydroxyl group of hydroxystyrene is linked with the lower alkylene group containing a tertiary carbon atom instead of the hydrogen atom thereof, and the other end of the lower alkylene group is linked with an aliphatic monocyclic group. In this case, the constitutional unit (a3-1) is dissociated from the part of the tertiary carbon atom of the lower alkylene group.

The main chain of the constitutional unit (a3-1) may be either a (meth)acrylic acid backbone or a hydroxystyrene backbone, while a (meth)acrylic acid backbone is preferable. Specifically, a (meth)acrylic acid backbone containing a 1-ethylcyclohexyl group is preferable because of industrial availability and inexpensiveness.

Constitutional Unit (a3-2)

Examples of the aliphatic polycyclic group include the groups of bicycloalkane, tricycloalkane, and tetracycloalkane, one of whose hydrogen atoms is removed. Specific examples of the aliphatic polycyclic group include the group of polycycloalkane such as adamantane, norbornene, isobornane, tricyclodecane, or tetracyclododecane, one of whose hydrogen atoms is removed. A suitable aliphatic polycyclic group can be selected from among the ones proposed as an acid dissociable dissolution inhibiting group in the resins for photoresist composition for use with ArF excimer lasers.

In these aliphatic polycyclic groups, an adamantyl group, a norbornyl group, and a tetracyclododecanyl group are preferable because of industrial availability, while an adamantyl group is particularly preferable.

Examples of the tertiary alkyl group containing an aliphatic polycyclic group include the aliphatic polycyclic group linked with the lower alkyl group as described in the constitutional unit represented by the general formula (V), which substitutes for the hydrogen atom of the carboxylic group of (meth)acrylic acid or the hydrogen atom of the hydroxyl group of hydroxystyrene, thereby forming an acid dissociable tertiary alkyl ester on the substituent ring.

It is possible to use the constitutional unit (a3-2) like the constitutional unit represented by the general formula (VI), wherein the carboxylic group of (meth)acrylic acid or the hydroxyl group of hydroxystyrene is linked with the lower alkylene group containing a tertiary carbon atom instead of the hydrogen atom thereof, and the other end of the lower alkylene group is linked with the aliphatic polycyclic group. In this case, the constitutional unit (a3-2) is dissociated from the part of the tertiary carbon atom of the lower alkylene group.

The main chain of the constitutional unit (a3-2) may be either a (meth)acrylic acid backbone or a hydroxystyrene backbone, while a (meth)acrylic acid backbone is preferable.

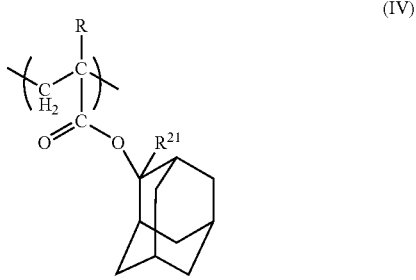

(IV)

In the general formula (IV), R represents a hydrogen atom or a methyl group, and $R^{21}$ represents a lower alkyl group. As $R^{21}$, a linear or branched lower alkyl group having a carbon number of 1 to 5 is preferable. Examples of $R^{21}$ include a methyl group, an ethyl group, a propyl group, an isopropyl group, a n-butyl group, an isobutyl group, a tert-butyl group, a pentyl group, an isopentyl group, and a neopentyl group. Among them, the alkyl groups having a carbon number of 2 or more, preferably 2 to 5 are preferable because they have high acid dissociability and high sensitivity compared to a methyl group. Meanwhile, a methyl group or an ethyl group is preferable industrially.

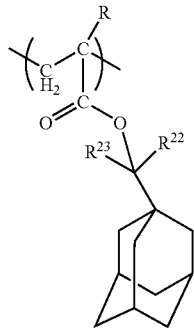

(V)

In the general formula (V), R represents a hydrogen atom or a methyl group, and $R^{22}$ and $R^{23}$ independently represent lower alkyl groups. It is preferable that the $R^{22}$ and $R^{23}$ independently represent alkyl groups having a carbon number of 1 to 5. These groups tend to have higher acid dissociability than a 2-methyl-2-adamantyl group.

Specifically, it is preferable that the $R^{22}$ and $R^{23}$ independently represent linear or branched lower alkyl groups being same as $R^{21}$. Among them, it is the industrially preferable that both of $R^{22}$ and $R^{23}$ be methyl groups, and a specific example includes the constitutional unit derived from 2-(1-adamantyl)-2-propyl(meth)acrylate.

Constitutional Unit (a3-3)

Constitutional unit (a3-3) has a cross-linking group represented by the aforementioned general formula (III) as an acid dissociable dissolution inhibiting group. This cross-linking group links at least two, preferably two or three of the constitutional units, and each constitutional unit has a carboxyl group or a hydroxyl group.

Examples of the lower alkyl groups represented by $R^3$ and $R^4$ (preferably having a carbon number of 1 to 5) include a methyl group, an ethyl group, a n-propyl group, an isopropyl group, a n-butyl group, an isobutyl group, a tert-butyl group, and a n-pentyl group. Also, A represents a single bond or a (n+1)-valent organic group, while a hydrocarbon having a carbon number of 1 to 20 is preferable.

When n is 1, examples of the hydrocarbon include a linear or branched alkylene group, a cycloalkylene group, and an arylene group. When n is 2, examples of the hydrocarbon include the trivalent groups of aforementioned linear or branched alkylene group, a cycloalkylene group, and an arylene group, one of whose hydrogen atoms is removed. Also, when n is 3, examples of the hydrocarbon include the tetravalent groups of aforementioned linear or branched alkylene group, cycloalkylene group, and arylene group, two of whose hydrogen atoms are removed.

It is particularly preferable that A be a linear alkylene group having a carbon number of 2 to 10, and that $R^3$ and $R^4$ be a methyl group.

There are no limitations on the structure of the main chain of a constitutional unit which is a target for cross-linking by a cross-linking group, and the examples thereof include a (meth)acrylate backbone and a hydroxystyrene backbone such as the aforementioned constitutional unit (a1), while the (meth)acrylate backbone is preferable.

It is preferable that the constitutional unit (a3-3) constitute the cross-linking structure as described in general formula (VI).

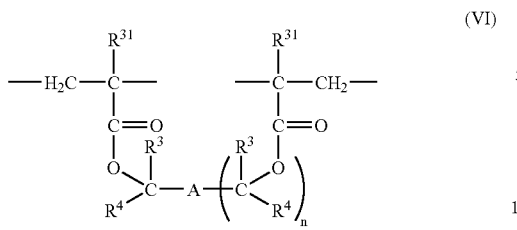

(VI)

In the general formula (VI), $R^{31}$ is a methyl group or a hydrogen group, and $R^3$, $R^4$, and A represent the same as in the aforementioned.

It is preferable for the cross-linking structure of the cross-linked unit that at least two of tertiary alkyl acrylates or tertiary alkyl methacrylates be cross-linked through the organic group in an alkyl group linking each tertiary carbon. By an action of an acid, ester groups change into carboxyl groups, so the resin component becomes alkaline soluble in the exposed part. In the unexposed part, the resin component remains alkaline insoluble since the cross-linking groups remain.

This cross-linking structure is derived from a diester, triester, or tetraester having 2 to 4 ethylenic unsaturated bonds which is obtained by linking acrylic acid or methacrylic acid, or reactive functional derivatives thereof such as 2 to 4 molecules of acid halide, with one molecule of alcohols having 2 to 4 hydroxyl groups such as diols, triols, or tetrols having a tertiary carbon atom linked with hydroxyl groups at each end.

Examples of the diols include glycols such as 2,3-dimethyl-2,3-butanediol, 2,3-diethyl-2,3-butanediol, 2,3-di-n-propyl-2,3-butanediol, 2,4-dimethyl-2,4-pentanediol, 2,4-diethyl-2,4-pentanediol, 2,4-di-n-propyl-2,4-pentanediol, 2,5-dimethyl-2,5-hexanediol, 2,5-diethyl-2,5-hexanediol, 2,5-di-n-propyl-2,5-hexanediol, 2,6-dimethyl-2,6-heptanediol, 2,6-diethyl-2,6-heptanediol, 2,6-di-n-propyl-2,6-heptanediol. Examples of the triols include triols such as 2,4-dimethyl-2,4-dihydroxy-3-(2-hydroxypropyl)pentane, 2,4-diethyl-2,4-dihydroxy-3 -(2-hydroxypropyl)pentane, 2,5-dimethyl-2,5-dihydroxy-3-(2-hydroxypropyl)hexane, 2,5-diethyl-2,5-dihydroxy-3-(2-hydroxypropyl)hexane. Examples of the tetrols include tetrols such as erythritol, pentaerythritol, or 2,3,4,5-hexanetetrol.

In the diester and trimester, the preferable examples include the diester represented by general formula (VII) and the triesters represented by general formulae (VIII) and (IX).

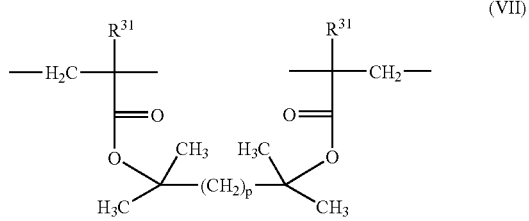

(VII)

In the general formula (VII), R31 represents same as the aforementioned, p represents 0, 1, or 2.

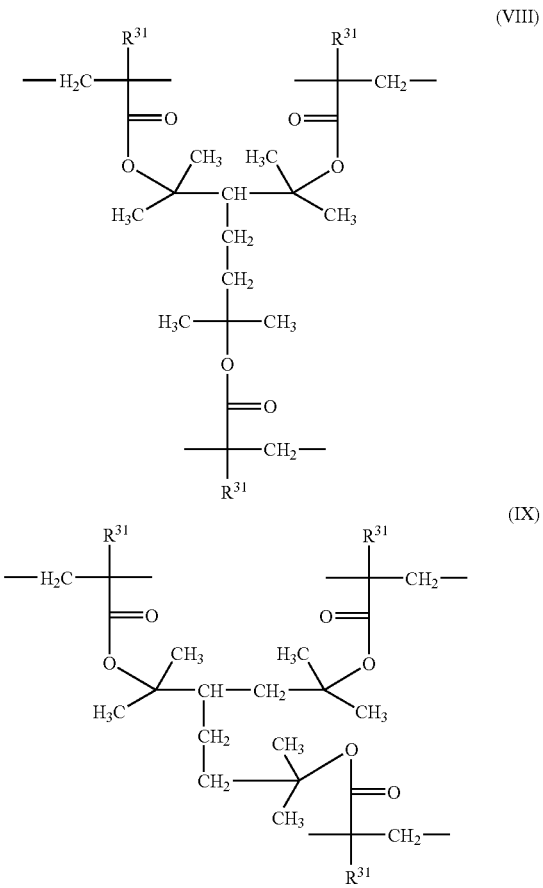

(VIII)

(IX)

In the general formulae (VIII) and (IX), $R^{31}$ represents the same as in the aforementioned.

The diester represented by the general formula (VII), wherein p is 2, is preferable as the acid dissociable dissolution inhibiting group of the constitutional unit (a3-3).

As the resin component (A1), it is possible to use the copolymer including one or more of the constitutional units (a1), one or more of the constitutional units (a2), and one or more of the constitutional units (a3), or the mixture of polymers including at least one of the constitutional units (a1), (a2), and (a3). Also, it is possible to combine these copolymers and the mixture.

The resin component (A1) can include an optional constitutional unit in addition to the constitutional units (a1), (a2), and (a3), while the percentage of the sum of the constitutional units (a1), (a2), and (a3) in the resin component (A1) is 80 mol % or more, preferably 90 mol % or more, most preferably 100 mol %.

The resin component (A1) is obtained by polymerizing the constitutional units with a conventional method.

Specifically, it is preferable to simultaneously use the copolymer (A1-4 constitutional units) consisting of the constitutional units (a1), (a2), (a3-1), and (a3-3) and the copolymer (A1-3 constitutional units) consisting of the constitutional units (a1), (a2), and (a3-2).

The resin component (A) may include any resin component whose alkaline solubility changes by an action of an acid except the resin component (A1), while it is preferable that the resin component (A) consists of the resin component (A1).

When the resin component (A1) is used as the resin component (A), the content of the constitutional unit (a1) in the resin component (A1) is 50 to 80 mol %, preferably 65 to 80 mol %. When the content of the constitutional unit (a1) is 50 mol % or more, the solubility in a developer becomes favorable, and the favorable resolution is obtained. When the content of the constitutional unit (a1) is 80 mol % or less, it is possible to suppress the thickness loss of the resist pattern.

The content of the constitutional unit (a3) in the resin component (A1) is 3 to 40 mol %, preferably 5 to 30 mol %. When the content of the constitutional unit (a3) is 3 mol % or more, the solubility in a developer becomes favorable, and the resolution is improved. When the content of the constitutional unit (a3) is 40 mol % or less, it is possible to maintain the balance with the other constitutional units.

The content of the constitutional unit (a3) in the resin component (A1) is 3 to 40 mol %, preferably 5 to 30 mol %. When the content of the constitutional unit (a3) is 3 mol % or more, the solubility in a developer becomes favorable, and the resolution is improved. When the content of the constitutional unit (a2) is 25 mol % or less, it is possible to maintain the balance with the other constitutional units.

The polystyrene equivalent weight average molecular weight determined using GPC (hereinafter abbreviated to weight average molecular weight or Mw) of the resin component (A1) is preferably 3000 to 50000, more preferably 5000 to 30000. The degree of dispersion (Mw/Mn) is preferably 1.0 to 5.0, more preferably 1.0 to 3.0.

The content of the resin component (A) in the resist composition is preferably 5 to 20% by mass, more preferably 8 to 15% by mass.

Component (B)

A suitable component B can be selected from among the known acid generators used in a conventional chemically amplified photoresist.

Examples of the known acid generator include an onium salt type acid generator such as iodonium salt or sulfonium salt; an oxime sulfonate type acid generator; a diazomethane type acid generator such as bis(alkylsulfonyl)- or bis(arylsulfonyl)-diazomethanes, poly(bissulfonyl)diazomethanes or diazomethanenitrobenzylsulfonates; an iminosulfonate type acid generator; a disufonic acid type acid generator, and these known acid generators can be used without any limitation.

Specific examples of the bis(alkylsulfonyl)- or bis(arylsulfonyl)-diazomethanes type acid generator of the diazomethane type acid generator include bis(isopropylsufonyl)diazomethane, bis(p-toluenesulfonyl)diazomethane, bis(1,1-dimethylethylsulfonyl)diazomethane, bis(cyclohexylsulfonyl)diazomethane, bis(cyclopentylsulfonyl)diazomethane, bis(2,4-dimethylphenylsulfonyl)diazomethane.

Specific examples of the poly(bissulfonyl)diazomethane type acid generator of the diazomethane type acid generator include 1,3-bis(phenylsulfonyldiazomethylsulfonyl)propane (compound A, decomposition point 135° C.), 1,4-bis(phenylsulfonyldiazomethylsulfonyl)butane (compound B, decomposition point 147° C.), 1,6-bis(phenylsulfonyldiazomethylsulfonyl)hexane (compound C, melting point 132° C., decomposition point 145° C.), 1,10-bis(phenylsulfonyldiazomethylsulfonyl)decane (compound D, decomposition point 147° C.), 1,2-bis(cyclohexylsulfonyldiazomethylsulfonyl)ethane (compound E, decomposition point 149° C.), 1,3-bis(cyclohexylsulfonyldiazomethylsulfonyl)propane (compound F, decomposition point 153° C.), 1,6-bis(cyclohexylsulfonyldiazomethylsulfonyl)hexane (compound G, decomposition point 109° C.), 1,10-bis(cyclohexylsulfonyldiazomethylsulfonyl)decane (compound H, decomposition point 116° C.).

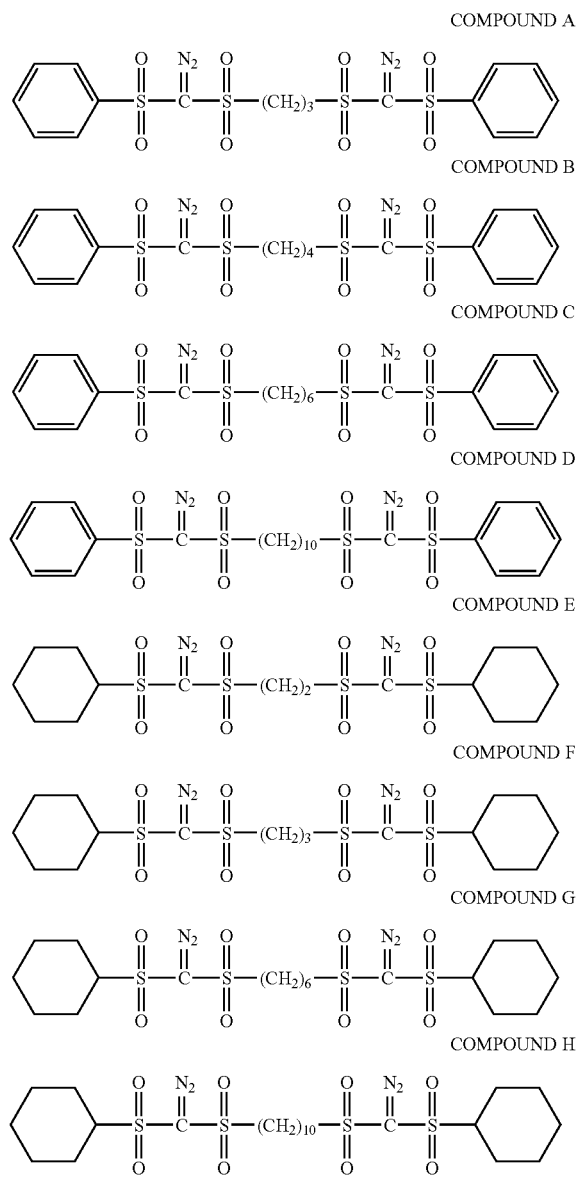

Specific examples of the oxime sulfonate type acid generator include α-(methylsulfonyloxyimino)-phenylacetonitrile, α-(methylsulfonyloxyimino)-p-methoxyphenylacetonitrile, α-(trifuloromethylsulfonyloxyimino)-phenylacetonitrile, α-(trifuloromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfonyloxyimino)-p-bromophenylacetonitrile, while α-(methylsulfonyloxyimino)-p-methoxyphenylacetonitrile is preferable.

Examples of the onium salt type acid generator include an iodonium salt type acid generator containing an iodine atom in a cation and a sulfonium salt type acid generator containing a sulfur atom in a cation as mentioned above.

Specific examples of the iodonium salt type acid generator include trifluoromethanesulfonate or nonafluorobutanesulfonate of diphenyliodonium, trifluoromethanesulfonate or nonafluorobutanesulfonate of bis(4-tert-butylphenyl)iodonium. Also, the compound represented by chemical formula (X) can be used preferably.

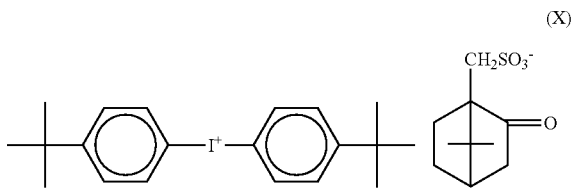

(X)

Specific examples of the sulfonium salt type acid generator include trifluoromethanesulfonate, heptafluoropropanesulfonate, or nonafluorobutanesulfonate of triphenylsulfonium; trifluoromethanesulfonate, heptafluoropropanesulfonate, or nonafluorobutanesulfonate of tri(4-methylphenyl)sulfonium; trifluoromethanesulfonate, heptafluoropropanesulfonate, or nonafluorobutanesulfonate of dimethyl(4-hydroxynaphtyl)sulfonium; trifluoromethanesulfonate, heptafluoropropanesulfonate, or nonafluorobutanesulfonate of monophenyldimethylsulfonium; trifluoromethanesulfonate, heptafluoropropanesulfonate, or nonafluorobutanesulfonate of diphenylmonomethylsulfonium.

It is possible to use one or a mixture of two or more of the components (B). The content of the component (B) is 0.5 to 30 parts by mass per 100 parts by mass of the resin component (A), preferably 1 to 10 parts by mass. When the content of the component (B) is 0.5 parts by mass or more, it is possible to perform the pattern formation sufficiently. When the content of the component (B) is 30 parts by mass or less, it is possible to obtain the homogeneous solution, and storage stability is improved. Nitrogen-containing organic compound (D)

In the positive resist composition of the present invention, the nitrogen-containing organic compound (D) (hereiafter abbreviated to component (D)) can be blended as an optional component so as to improve the shape of the resist pattern and post exposure stability of the latent image formed by the pattern-wise exposure of the resist layer.

A suitable component (D) can be selected from the various things which have already been proposed as the component (D), while amine, specifically secondary aliphatic amine or tertiary aliphatic amine is preferable. This aliphatic amine is the amine having an alkyl group or an alkylalkoxyl group having a carbon number of 1 to 15. Specific examples of these secondary and tertiary amine include trimethylamine, diethylamine, di-n-propylamine, tri-n-propylamine, tripentylamine, tridodecylamine, trioctylamine, diethanolamine, triethanolamine, triisopropanolamine, while the tertiary alkanolamine such as triethanolamine or triisopropanolamine is preferable.

In addition, trispolyalkoxyalkylamine such as tris-(2-methoxymethoxyethyl)amine, tris-2-(2-methoxy(ethoxy)) ethylamine, or tris-(2-(2-methoxyethoxy)methoxyethyl) amine is also included, while tris-2-(2-methoxy(ethoxy)) ethylamine is preferable among them.

It is possible to use one or the mixture of two or more of these amines. The content of the component (D) is usually 0.01 to 5.0 parts by mass per 100 parts by mass of the component (A).

Organic carboxylic acid, or oxoacid of phosphorous or a derivative thereof (E) (hereinafter abbreviated to component (E)) can be comprised as an optional component so as to improve the shape of the resist pattern and post exposure stability of the latent image formed by the pattern wise exposure of the resist layer and to suppress the deterioration of sensitivity due to the blend of the component (D). It is possible to use one or both of the component (D) and (E).

Component (E)

Preferable examples of the component (E) include malonic acid, citric acid, malic acid, succinic acid, benzoic acid, and salicylic acid. Examples of oxoacid of phosphorous or a derivative thereof include phosphoric acid and ester derivatives thereof such as phosphoric acid, di-n-butyl phosphate, diphenyl phosphate; phosphonic acid or derivatives thereof such as phosphonic acid, dimethyl phosphonate, di-n-butyl phosphonate, phenylphosphonic acid, diphenyl phosphonate, dibenzyl phosphonate; phosphinic acid or ester derivatives thereof such as phosphinic acid and phenylphosphinic acid, while phosphonic acid is particularly preferable among them.

The content of the component (E) is 0.01 to 5.0 parts by mass per 100 parts by mass of the component (A).

Other Optional Components

Miscible additives can also be added to the positive resist composition of the present invention according to need, and possible additives include additive resins for improving the properties of the resist film, surfactants for improving the coating property, dissolution inhibitors, plasticizers, stabilizers, colorants and halation prevention agents.

The positive resist composition of the present invention can be produced by dissolving each component in an organic solvent. For example, each component in an organic solvent can be mixed or stirred in a conventional method, and where required it is possible to use a dispersion machine such as a dissolver, homogenizer, or 3 rolling mills. In addition, the filtration can be performed using mesh or membrane filters.

Organic Solvent

The organic solvent may be any solvent capable of dissolving each component to form a homogenous solution, and either one, or two or more solvents typically used in conventional chemically amplified resists can be selected as appropriate.

Examples of the organic solvent include ketones such as γ-butyrolactone, acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate. These organic solvents may be used singularly, or in mixed solvents of two or more different solvents.

It is preferable to use at least one of propylene glycol monomethyl ether acetate (PGMEA), propylene glycol monomethyl ether (PGME), and ethyl lactate (EL). Also, the mixed solvent of propylene glycol monomethyl ether acetate (PGMEA) and a polar solvent is preferred. The mixture ratio is preferably within the range of 1:9 to 8:2 by mass, more preferably 2:8 to 5:5 by mass.

Specifically, in the case of blending the EL as a polar solvent, the mass ratio of PGMEA:EA is preferably 2:8 to 5:5, more preferably 3:7 to 4:6.

Also, the mixed solvent of γ-butyrolactone and at least one selected from PGMEA and EL is preferable as an organic solvent. In this case, as the mixture ratio, mass ratio of the former and the latter is preferably 70:30 to 95:5.

The amount of the organic solvent is not specifically limited and is determined as appropriate according to the thickness of coating film and the concentration capable of coating on a substrate. Generally, the concentration of the solid part of the resist composition is 2 to 20% by mass, preferably 5 to 15% by mass.

Resist Pattern Formation Method

The resist pattern formation method of the present invention can be performed as follows.

First, the positive photoresist composition of the present invention is applied to a substrate such as a silicon wafer using a normal application method such as a spinner. The formation of the resist layer is then completed by performing the prebaking at 80 to 150° C. for 40 to 120 seconds, preferably 60 to 90 seconds. An organic or inorganic anti-reflective film can be performed between the substrate and the application layer. There is no particular limitation on the thickness of the application layer, while 150 to 800 nm is usual.

Next, the formed application layer of the photoresist composition is selectively exposed through a desired mask pattern. Subsequently, PEB (Post Exposure Baking) is performed at 80 to 150° C. for 40 to 120 seconds, preferably 60 to 90 seconds. KrF excimer laser is preferable as the light source.

Finally, the development is performed using an alkaline developer such as a 0.1 to 10% by mass of tetramethyl ammonium hydroxide. Thus, a resist pattern corresponding to the mask pattern is obtained.

According to the positive resist composition of the present invention, it is possible to simultaneously achieve favorable resolution and the favorable shape of the resist pattern. In addition, depth of focus is also improved.

EXAMPLES

The following is a more detailed description of the present invention based on a series of examples, although the present invention is in no way limited to the examples presented.

Example 1

Component (A), component (B), component (D), surfactant, and PPG are dissolved in the organic solvent to prepare the homogeneous solution, thereby producing the positive resist composition.

Component (A): 100 Parts by Mass of the Following Resins

The mixture of the resin (1) represented by chemical formula (XI) and the resin (2) represented by chemical formula (XII) are used as the resin component (A).

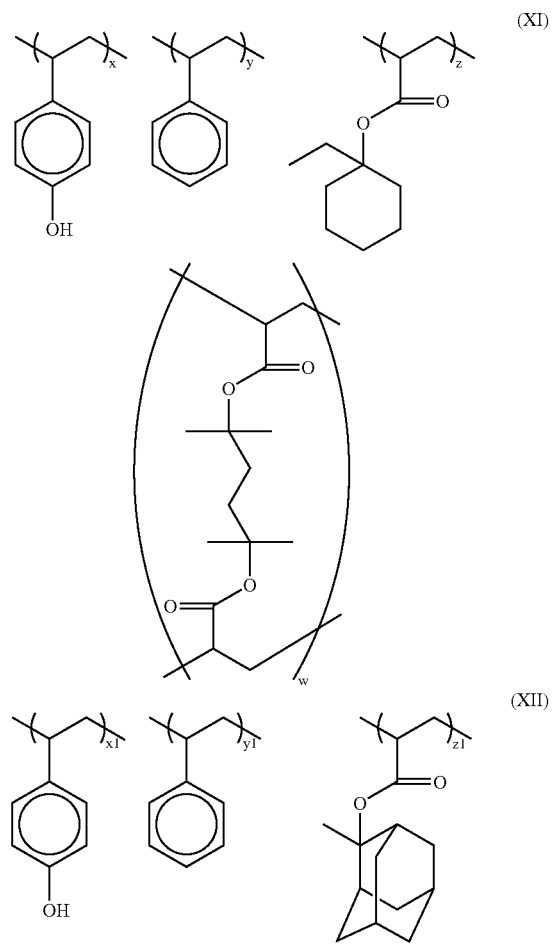

The ratio of the mixture of the resin (1) and (2) is 1:1 by mass.

The resin (1) is the copolymer randomly including the constitutional units as described in the chemical formula (1), wherein Mw is 27000, Mw/Mn is 4.0, and x:y:z:w=70:5:20:5 by mol. This resin (1) corresponds to the aforementioned copolymer (A1-4 constitutional units).

The resin (2) is the copolymer randomly including the constitutional units as described in the chemical formula (2), wherein Mw is 12000, Mw/Mn is 2.0, and x1:y1:z1=70:10:20 by mol. This resin (2) corresponds to the aforementioned copolymer (A1-3 constitutional units).

Component (B): 5.0 parts by mass of triphenylsulfonium-nonafluorobuthane sulfonate.

Component (D): 0.25 parts by mass of triisopropanol amine.

PPG: 1.5 parts by mass of polypropylene glycol (molecular weight 1000).

Organic solvent: ethyl lactate.

The solution was prepared, wherein the concentration of solid part of the resist became 12% by mass.

Comparative Example 1

The Example Without PPG

With the exception of using the 100 parts by mass of the resin (1) as the component (A) and adding no propylene glycol in the example 1, resist patterns were prepared in the same manner as the example 1.

Comparative Example 2

The Example Without PPG

With the exception of using the 100 parts by mass of the resin (2) as the component (A) and adding no propylene glycol in the example 1, resist patterns were prepared in the same manner as the example 1.

Test Example 1

The formations of resist patterns were performed using the positive resist composition obtained in the aforementioned example 1 and comparative examples 1 and 2.

The positive resist composition was applied onto the silicon wafer with a diameter of 8 inches, on whose surface the organic antireflection film with the thickness of 90 nm (manufactured by Shipley Company, Trade Name: AR3) was formed previously, with the spinner, followed by pre-baking (PAB) on the hotplate at 110° C. for 60 seconds, and drying, thereby forming the resist film with a thickness of 380 nm.

Subsequently, the resist film was selectively exposed, through the half-tone typed mask pattern (transmittance 6%), with the KrF excimer laser (248 nm), using the KrF reduction projection exposure apparatus S-203B (manufactured by Nikon Corporation, Numeral Aperture=0.68, σ=0.75).

Then, the PEB treatment was performed for 60 seconds at 130° C., and the development was performed with 2.38% by mass of tetramethylammonium hydroxide aqueous solution for 60 seconds, thereby forming the positive resist pattern.

The contact hole pattern could be formed in all the positive resist compositions of example 1 and comparative example 1 and 2. The exposure which can truly reconstruct the contact hole pattern at 160 nm (Eop exposure) was measured.

In the test example 1, when the positive resist of the example 1 was used, Eop exposure was 56 mJ/cm$^2$, and the depth of focus (DOF) was 0.6 mm. Also, the contact hole pattern had the favorable shape and good formability. The standing wave of the side walls of the contact hole was suppressed.

In contrast, when the positive resist of comparative example 1 was used, Eop exposure was 50 mJ/cm$^2$, and the depth of focus (DOF) was 0.4 mm. Also, the contact hole pattern had the T-top shape and was poor in terms of formability and DOF.

In contrast, when the positive resist of comparative example 2 was used, Eop exposure was 60 mJ/cm$^2$, and the depth of focus (DOF) was 0.6 mm. Also, the contact hole pattern had a tapered shape, and the standing wave occurred.

Accordingly, in the example 1 and the comparative examples 1 and 2, it was possible to form the contact hole pattern with the diameter of 160 nm, and there was no significant difference in terms of the resolution. However, in the example 1, it was possible to simultaneously achieve the broad DOF and the favorable shape of the resist pattern, while, in comparative example 1, DOF and the shape of the resist pattern were poor, and, in comparative example 2, DOF was favorable, but the shape of the resist pattern was poor.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A positive resist composition comprising:
   a resin component (A) whose alkaline solubility changes by an action of an acid;
   an acid generator component (B); and
   polypropylene glycol, wherein
   the component (A) comprises a resin component (A1) including a constitutional unit (a1) represented by general formula (I), a constitutional unit (a2) represented by general formula (II), and a constitutional unit (a3) having an acid dissociable dissolution inhibiting group which includes a constitutional unit (a3-1) whose acid dissociable dissolution inhibiting group is a tertiary alkyl group containing an aliphatic monocyclic group,

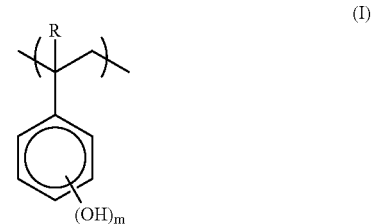

wherein R represents a hydrogen atom or a methyl group, and m represents an integer of 1 to 3,

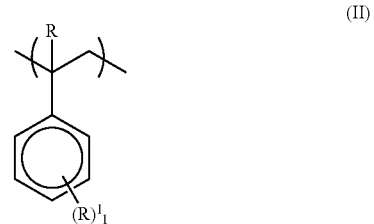

wherein R represents a hydrogen atom or a methyl group, and R$^1$ represents alkyl group having a carbon number of 1 to 5, and l represents an integer of 0 to 3.

2. A positive resist composition comprising:
   a resin component (A) whose alkaline solubility changes by an action of an acid;
   an acid generator component (B); and
   polypropylene glycol, wherein
   the component (A) comprises a resin component (A1) including a constitutional unit (a1) represented by general formula (I), a constitutional unit (a2) represented by general formula (II), and a constitutional unit (a3) having an acid dissociable dissolution inhibiting group which includes a constitutional unit (a3-2) whose acid dissociable dissolution inhibiting group is a tertiary alkyl group containing an aliphatic polycyclic group,

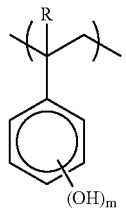

(I)

wherein R represents a hydrogen atom or a methyl group, and m represents an integer of 1 to 3,

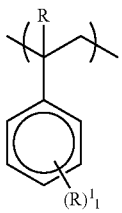

(II)

wherein R represents a hydrogen atom or a methyl group, and $R^1$ represents alkyl group having a carbon number of 1 to 5, and l represents an integer of 0 to 3.

3. A positive resist composition comprising:

a resin component (A) whose alkaline solubility changes by an action of an acid;

an acid generator component (B); and polypropylene glycol, wherein the component (A) comprises a resin component (A1) including a constitutional unit (a1) represented by general formula (I), a constitutional unit (a2) represented by general formula (II), and a constitutional unit (a3) having an acid dissociable dissolution inhibiting group which includes a constitutional unit (a3-3) whose acid dissociable dissolution inhibiting group is a cross-linking group represented by general formula (III) whose structure of the main chain which is a target for cross-linking by the cross-linking group is a (meth) acrylate backbone,

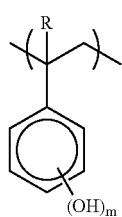

(I)

wherein R represents a hydrogen atom or a methyl group, and m represents an integer of 1 to 3,

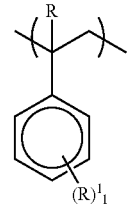

(II)

wherein R represents a hydrogen atom or a methyl group, and $R^1$ represents alkyl group having a carbon number of 1 to 5, and l represents an integer of 0 to 3, $$\begin{array}{c} R^3 \\ | \\ -C-A \\ | \\ R^4 \end{array} \left[ \begin{array}{c} R^3 \\ | \\ C- \\ | \\ R^4 \end{array} \right]_n$$

(III)

wherein $R^3$ and $R^4$ independently represent lower alkyl groups, and n represents an integer of 1 to 3, and A represents a single bond or a (n+1)-valent organic group.

4. A positive resist composition according to claim 1, 2 or 3, wherein the percentage of the constitutional unit (a2) in the component (A) is 1 to 25 mol %.

5. A positive resist composition according to claim 1, 2 or 3, wherein the content of the polypropylene glycol is 0.2 to 5.0 parts by mass per 100 parts by mass of the component (A).

6. A positive resist composition according to claim 1, 2 or 3 further comprising:

a nitrogen-containing organic compound (D).

7. A resist pattern formation method comprising:

applying the positive resist composition according to claim 1, 2 or 3 on a substrate, followed by prebaking, selective exposure, post exposure baking, and alkaline development, thereby forming a resist pattern.

8. A positive resist composition comprising:

a resin component (A) whose alkaline solubility changes by an action of an acid;

an acid generator component (B); and polypropylene glycol, wherein the component (A) comprises a resin component (A1) including a constitutional unit (a1) represented by general formula (I), a constitutional unit (a2) represented by general formula (II), and a constitutional unit (a3) having an acid dissociable dissolution inhibiting group which comprises a combination of two or more selected from a constitutional unit (a3-1) whose acid dissociable dissolution inhibiting group is a tertiary alkyl group containing an aliphatic monocyclic group, a constitutional unit (a3-2) whose acid dissociable dissolution inhibiting group is tertiary alkyl group containing an aliphatic polycyclic group, and a constitutional unit (a3-3) whose acid dissociable dissolution inhibiting group is a cross-linking group represented by general formula (III) whose structure of the main chain which is a target for cross-linking by the cross-linking group is a (meth) acrylate backbone,

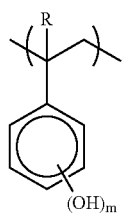
(I)

wherein R represents a hydrogen atom or a methyl group, and m represents an integer of 1 to 3,

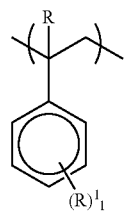
(II)

wherein R represents a hydrogen atom or a methyl group, and R¹ represents alkyl group having a carbon number of 1 to 5, and l represents an integer of 0 to 3,

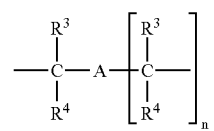
(III)

wherein $R^3$ and $R^4$ independently represent lower alkyl groups, and n represents an integer of 1 to 3, and A represents a single bond or a (n+1)-valent organic group.

* * * * *